US006323524B1

(12) United States Patent
May et al.

(10) Patent No.: US 6,323,524 B1
(45) Date of Patent: Nov. 27, 2001

(54) SEMICONDUCTOR DEVICE HAVING A VERTICAL ACTIVE REGION AND METHOD OF MANUFACTURE THEREOF

(75) Inventors: Charles E. May; Robert Dawson, both of Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/143,480

(22) Filed: Aug. 28, 1998

Related U.S. Application Data

(62) Division of application No. 08/859,160, filed on May 20, 1997, now Pat. No. 5,846,862.

(51) Int. Cl.⁷ .................................................. H01L 29/76
(52) U.S. Cl. ........................... 257/382; 257/401; 257/622
(58) Field of Search .................................... 257/382, 377, 257/622, 401, 347, 330

(56) References Cited

U.S. PATENT DOCUMENTS

| 4,016,587 | * | 4/1977 | De La Moneda | 257/382 |
| 4,689,871 | * | 9/1987 | Malhi | 257/401 |
| 4,803,176 | * | 2/1989 | Bower | 257/622 |
| 4,903,108 | * | 2/1990 | Young et al. | 257/622 |
| 4,933,733 | * | 6/1990 | Iranmanesh et al. | 257/514 |
| 4,952,993 | * | 8/1990 | Okumura | 257/382 |
| 5,043,778 | * | 8/1991 | Teng et al. | 257/382 |
| 5,285,093 | * | 2/1994 | Lage et al. | 257/401 |
| 5,352,915 |   | 10/1994 | Hutchings et al. | 257/361 |
| 5,430,673 | * | 7/1995 | Hong et al. | 257/377 |
| 5,457,070 |   | 10/1995 | Hirade | 437/195 |
| 5,512,517 |   | 4/1996 | Bryant | 437/203 |
| 5,563,080 |   | 10/1996 | Ahn | 437/41 |
| 5,844,274 | * | 12/1998 | Tsutsumi | 257/344 |
| 5,846,862 | * | 12/1998 | May et al. | 438/270 |

FOREIGN PATENT DOCUMENTS

| 196 15 692 A1 | 2/1997 | (DE) . |  |
| 0 299 505 A2 | 1/1989 | (EP) . |  |
| 0 766 306 A1 | 4/1997 | (EP) . |  |
| 57-097672 | 6/1982 | (JP) . |  |
| 57141968 | * 9/1982 | (JP) | 257/382 |
| 60103671 | * 6/1985 | (JP) | 257/382 |

* cited by examiner

Primary Examiner—Mark V. Prenty

(57) ABSTRACT

A semiconductor device and method of manufacture thereof is provided. According to one embodiment, a semiconductor device is formed by forming a trench within a substrate. An oxide layer is formed within the trench and portions of the oxide layer are removed to expose one or more portions of the substrate within the trench. A plurality of doped polysilicon pillars are formed within the trench. The doped polysilicon pillars include one or more active region pillars formed on the one or more exposed portions of the substrate.

14 Claims, 5 Drawing Sheets

US 6,323,524 B1

SEMICONDUCTOR DEVICE HAVING A VERTICAL ACTIVE REGION AND METHOD OF MANUFACTURE THEREOF

This application is a Divisional of application Ser. No. 08/859,160, filed May 20, 1997, now U.S. Pat. No. 5,846,862, which application(s) are incorporated herein by reference.

FIELD OF THE INVENTION

The present invention is directed generally to semiconductor devices and to a method of manufacture thereof and, more particularly, to fabrication of semiconductor devices having vertically formed active regions.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed within the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single wafer, improved performance and capabilities of electronic devices can be achieved. In order to increase the number of semiconductor devices which may be formed on a given surface area of a substrate, the semiconductor devices must be scaled down (i.e., made smaller). This is typically accomplished by reducing the lateral dimensions of the device structure. Continued efforts to reduce the dimensions of the semiconductor devices encounter problems related to device performance. Thus, there generally exist a tension between desires to further scale down the semiconductor devices and the need to maintain high performance and reliability.

SUMMARY OF THE INVENTION

Generally, the present invention relates to a semiconductor device and fabrication process in which devices are formed having vertical active regions. In accordance with one embodiment of the invention, a semiconductor device is formed by forming a trench within a substrate. An oxide layer is formed within the trench and portions of the oxide layer are removed to expose one or more portions of the substrate within the trench. A plurality of doped polysilicon pillars are formed within the trench. The doped polysilicon pillars include one or more active region pillars formed on the one or more exposed portions of the substrate.

In accordance with another embodiment of the invention, a semiconductor device is provided. The semiconductor device includes a substrate having a trench formed therein and at least one vertical source/drain region formed within the trench. The vertical source/drain region includes a doped polysilicon pillar as well as a doped region of the substrate.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
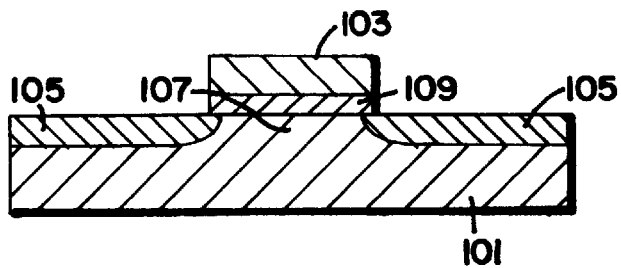
FIG. 1 illustrates elements of a typical MOS transistor.

While the invention is amenable to various modifications and alternative forms, specifics thereof have been shown by way of example in the drawings and will be described in detail. It should be understood, however, that the intention is not to limit the invention to the particular embodiments described. on the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is applicable to a number of semiconductor devices. The present invention is believed to be particularly suited to fabrication of MOS transistors having vertically formed active regions. While the present invention is not limited to such devices, an appreciation of various aspects of the invention will be gained through a discussion of various fabrication processes and device characteristics in connection with the examples provided below.

Figure 2A:
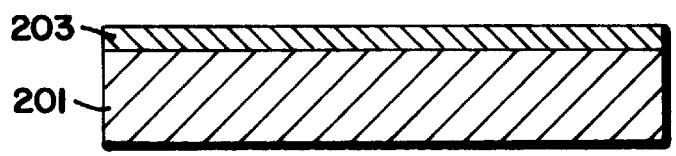
FIGS. 2A through 2G illustrate a fabrication process in accordance with an embodiment of the invention.
Figure 2B:
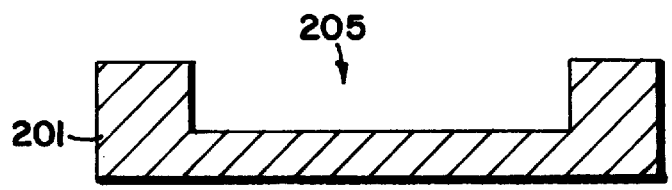

FIGS. 2A through 2G illustrate a fabrication process in accordance with one particular embodiment of the invention. As illustrated in FIG. 2A, the fabrication process uses a substrate 201, such as a silicon substrate, on which an isolation oxide 203 has been formed. The isolation oxide 203 is typically on the order of 100 to 300 angstroms (Å). A trench 205 is defined within the substrate 201 as illustrated in FIG. 2B. The trench 205 may be formed, for example, using conventional lithographic and etching techniques to a depth on the order of 1500 to 2000 Å.

Figure 2C:
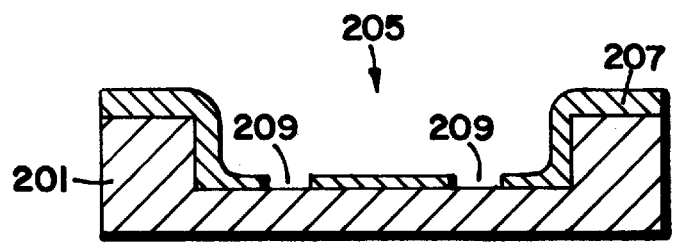
Figure 2D:
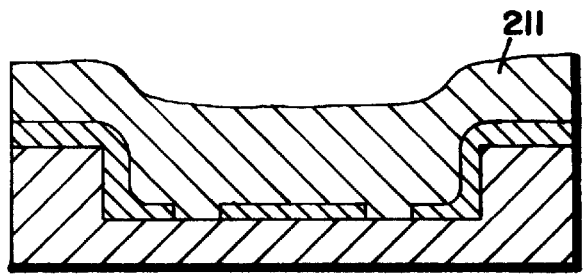

An oxide layer 207 is formed within the trench 205. Portions of the oxide layer 207 within the trench 205 are removed to expose portions of the substrate 209. The resultant structure is illustrated in FIG. 2C. The oxide layer may be formed and removed using, for example, well-known deposition and etching techniques. The oxide thickness may range for example, from 30 to 60 Å. As will be appreciated from the description below, the oxide layer 207 will be used to form a gate oxide to insulate a gate electrode from the substrate.

A relatively thick polysilicon layer 211 is formed over the structure depicted in FIG. 2C. This may be done by deposition, for example. The thickness of the polysilicon layer may range, for example, between 1500 to 2000 Å.

Figure 2E:
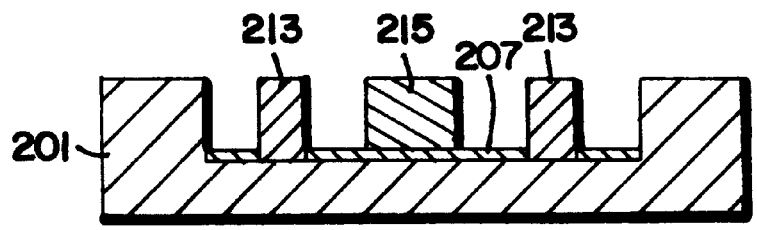

As illustrated in FIG. 2E, portions of the polysilicon layer 211 may be removed, for example, by etching, to form polysilicon pillars 213 over the portions of the substrate exposed during the removal of the oxide layer 207 and a polysilicon a pillar 215 on the oxide layer 207. As will be discussed more fully below, the pillars 213 in contact with the substrate 201 may be used to form vertical source/drain regions in the device, while the pillar 215 which rests on the oxide layer 207 may be used to form a gate electrode. While the invention is readily suitable to the formation of source/drain regions, the invention is not so limited. Other types of active regions can be formed using the invention.

Figure 2F:
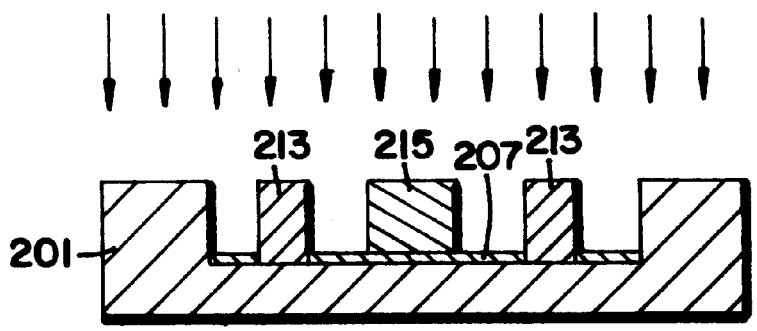

As illustrated in FIG. 2F, the polysilicon source/drain pillars 213 as well as the gate electrode pillar 215 are doped to provide desired conductivity. For example, P-type or N-type dopants may be used depending upon the device structure being fabricated. The doping may, for example, be performed using standard implantation techniques at dopant concentration and energy levels suitably selected in consideration of the desired conductivity. Dopant concentrations of about 1E15 to 1E16 and energy levels of 1 to 50 KeV would be suitable for many applications. It is noted that, in an alternative embodiment, the polysilicon layer 211 may be doped prior to formation of the pillars. The polysilicon source/drain pillars 213 may alone form the source and drain regions of the semiconductor device. In other embodiments, as will be discussed more fully below, regions of the substrate 201 between the polysilicon pillars 213 and the gate electrode pillar 215 may be doped to form doped regions of the substrate which together with the polysilicon pillars 213 form source and drain regions.

Figure 2G:
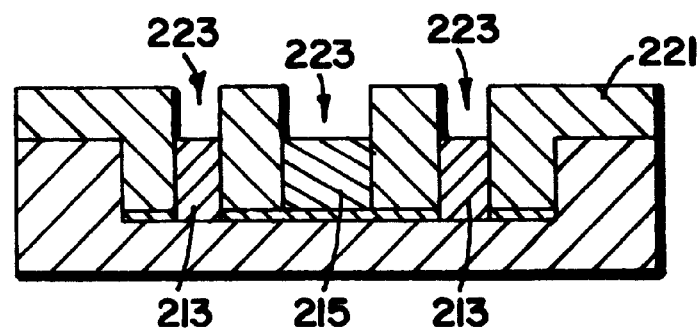

After formation of the pillars, a relatively thick oxide layer 221 may be formed over the substrate using, for example, well-known deposition techniques. Contact holes 223 may then be cut to expose surfaces of the source/drain pillars 213 and gate electrode pillar 215, for example, using well known etching techniques. The resultant structure is depicted in FIG. 2G. Subsequent processing may continue with the formation of contact layers, etc.

Using the above process, transistors can be formed having increased lateral density. In particular, by forming vertical active devices within a trench, the vertical height of the active devices may be increased and the lateral area decreased, while maintaining a volume substantially the same as a conventionally formed active device, if desired. As will be appreciated, the vertical depth of the pillars can be greater than the lateral width of the pillars. This allows for the active devices to be closer together and increases the density of the chip. By using the above process to form vertical source/drain regions, it is possible to control the amount of charge capability in the source/drain regions to be substantially the same as conventional source/drain regions, while minimizing the overall area (lateral) density for the device being produced. Moreover, by placing vertical active regions within a trench, the planarity of produced devices may be increased, thus enhancing, for example, the ability to do fine-resolution lithography.

It will be appreciated that the above-described process can be used to fabricate a number of different types of devices. For example, in addition to the more conventional type of devices, the process may be used to form silicon-on-insulator (SOI) devices. Indeed, the process is particularly suited for SOI devices since it does not depend on back side contacts. In one exemplary SOI embodiment, a layer of silicon is formed over an insulator using, for example, well-known techniques. The silicon layer is subject to the processing discussed above with respect to the silicon substrate to form vertical active regions in the silicon layer.

While the above-process is not so limited, the following description illustrates use of the process in conjunction with the formation of source/drain regions in the substrate. In certain instances, it is desirable to form a source/drain region which has an uneven conductivity profile (i.e., heavily and lightly doped regions) such as a lightly-doped drain (LDD) device. FIGS. 3A through 3D illustrates fabrication steps for forming an LDD device in accordance with one particular embodiment of the invention.

Figure 3A:
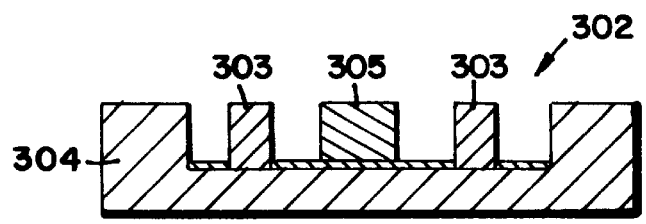
FIGS. 3A through 3D illustrate a fabrication process in accordance with another embodiment of the invention.
Figure 3B:
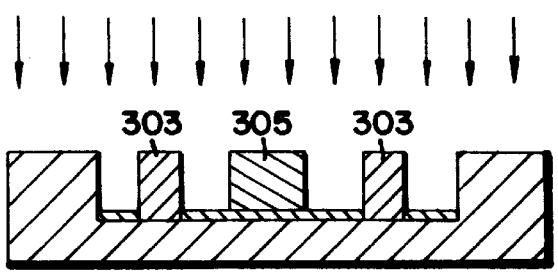

FIG. 3A illustrates polysilicon pillars 303 and 305 formed within a trench 302 of a substrate 304. The structure illustrated in FIG. 3A may be constructed using a process similar to that illustrated in FIGS. 2A through 2E. As illustrated in FIG. 3B, the polysilicon pillars may be doped to a desired concentration level. Doping of the pillars may be done in a similar manner as discussed above.

Figure 3C:
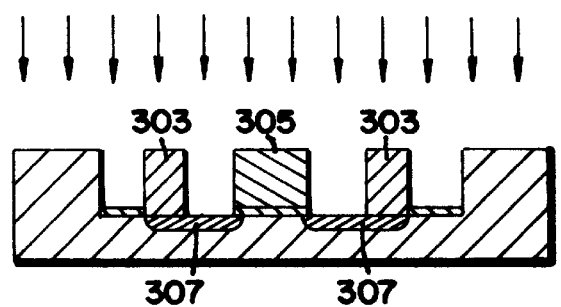

After the pillars 303 and 305 have been doped, portions of the substrate lying between the source/drain pillars 303 and the gate electrode pillar 305 are exposed, for example, by etching the oxide layer. The exposed areas of the substrate are doped, for example, by implantation, to form lightly doped regions 307. The resultant structure is depicted in FIG. 3C. Dopant implantation may, for example, be performed using standard implantation techniques with energy levels and dopant concentrations suitably selected based on the desired profile of the LDD regions 307.

Figure 3D:
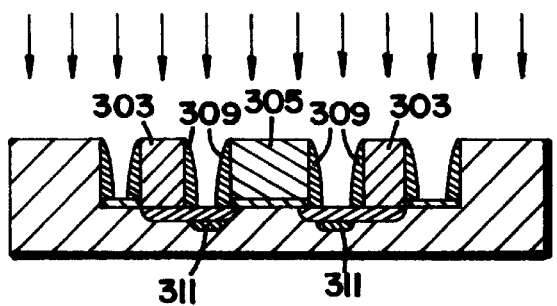

Spacers 309 may be formed on sidewalls of the gate electrode 305 and sidewalls of the source/drain regions 303, as illustrated in FIG. 3D. The spacers 309 may, for example, be formed using conventional deposition and etching techniques. With the spacers in place, exposed portions of the substrate between source/drain regions 303 and the gate electrode 305 are doped with a heavier dopant concentration to form heavier doped regions 311. The resultant structure is illustrated in FIG. 3D. The combination of the source/drain pillar 303, the LDD region 307 and the heavy doped region 311 together forms an active source/drain region of the device being formed. In an alternative embodiment, the subsequent heavy dose implant may be omitted. In this embodiment, the LDD region and the pillars may be used to form the entire active structure.

Figure 4A:
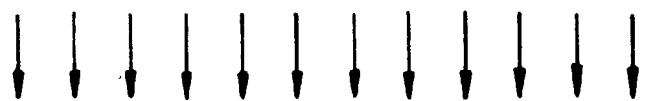
FIGS. 4A through 4B illustrate a fabrication process in accordance with still another embodiment of the invention.
Figure 4B:
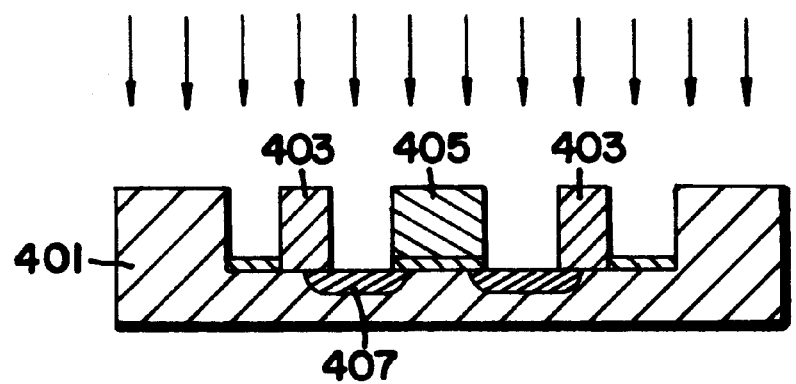

In another embodiment of the invention, illustrated in FIGS. 4A and 4B, after doping the pillar structures as illustrated in FIG. 4A, portions of the substrate between source/drain pillars 403 and a gate electrode pillar 405 are exposed and heavily doped to form source/drain active regions 407 within the substrate 401. As will be appreciated, from the preceding examples, a relatively thick source/drain pillar region together with a doped region of the substrate may be used to form a vertical active source/drain region. The vertical thickness or height of the elevated active region pillar may be on the order of 1500 to 2000 Å.

Figure 5A:
FIGS. 5A through 5C illustrate a fabrication process in accordance with yet another embodiment of the invention.
Figure 5B:
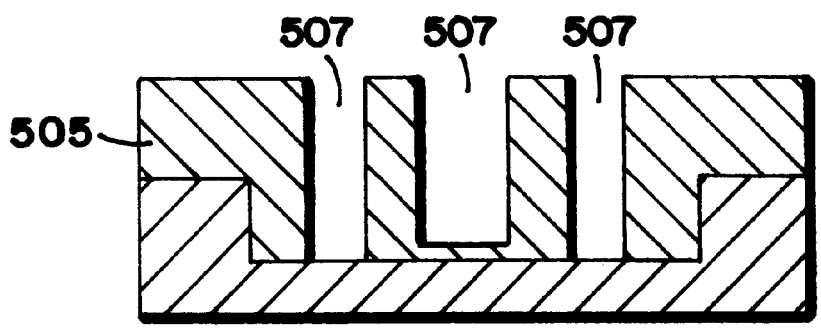
Figure 5C:
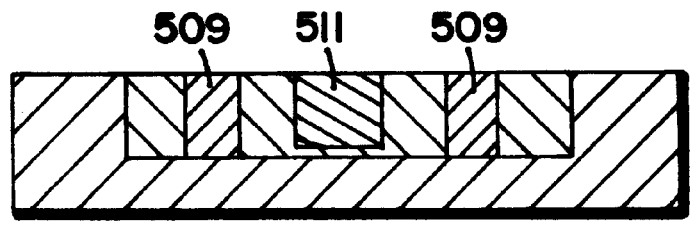

It will be appreciated that a number of different variations and processing techniques may be used to form the vertical pillar structure illustrated in the above examples. For example, as illustrated in FIGS. 5A through 5C, a trench 503 may first be formed in a substrate 501. A relatively thick oxide layer 505 may then be formed over the substrate and etched to form contact holes 507 as illustrated in FIG. 5B. The contact holes 507 may then be filled with a polysilicon material and the resultant structure polished to form a trench having source/drain pillars 509 and a gate electrode pillar 511 disposed therein, as illustrated in FIG. 5C. In still another alternative, source/drain pillars may be formed by selectively etching the substrate and leaving pillars formed of the intact substrate material.

As noted above, the present invention is applicable to the fabrication of a number of different devices having a vertically formed active region. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor device, comprising:
a substrate having a trench formed within the substrate;
at least one vertical source/drain region formed within the trench, the at least one vertical source/drain region including a doped polysilicon pillar having a vertical depth greater than a width of the pillar; and
a gate oxide disposed in the trench and a gate electrode pillar formed on the gate oxide, wherein a top surface of the gate electrode pillar and of the doped polysilicon pillar are planar with a top surface of the substrate.

2. A semiconductor device, comprising:
a substrate having a trench formed within the substrate;
a first vertical active region formed within the trench, the first vertical active region including a doped polysilicon pillar that has a vertical depth greater than a width of the pillar; and
a gate electrode pillar disposed in the trench adjacent the vertical active region wherein the doped polysilicon pillar defines a top surface planar with a top surface of the gate electrode pillar and planar with a top surface of the substrate.

3. A semiconductor device, comprising:
a substrate having a trench formed therein, the substrate including an insulator and a silicon layer formed on the insulator, the silicon layer having the trench formed therein;
a first vertical active region formed within the trench, the first vertical active region including, a doped polysilicon pillar that has a vertical depth greater than a width of the pillar; and
a gate electrode pillar disposed in the trench adjacent the vertical active region wherein the doped polysilicon pillar defines a top surface planar with a top surface of the gate electrode pillar.

4. A semiconductor device, comprising:
a silicon substrate having a trench within the substrate, the trench having a set of sidewalls and a bottom surface;
a insulative layer formed within the trench, the insulative layer comprised of a plurality of insulative portions that are disposed within the trench, a first and a second insulative portion being disposed at each sidewall, and a third u-shaped insulative portion configured to receive a gate electrode and disposed on the bottom surface between the first and second insulative portions; and
at least one vertical active region formed within the trench, each vertical active region including a doped polysilicon pillar having a vertical depth greater than a width of the pillar, the doped polysilicon pillar being in contact with a silicon substrate surface defining the bottom of the trench and in contact with the third insulative portion
wherein the at least one vertical active region includes two vertical active regions that are each a source/drain region, each source/drain region disposed on a side of and in contact with the third insulative portion.

5. A semiconductor device, comprising:
a substrate having a trench formed therein;
at least one vertical source/drain region formed within the trench, the at least one vertical source/drain region including a doped polysilicon pillar having a vertical depth greater than a width of the pillar, the vertical depth ranging from about 1500 to 2000 Å, wherein the vertical source/drain region includes a doped region of the substrate adjacent the pillar; and
a gate oxide disposed in the trench and a gate electrode pillar formed on the gate oxide.

6. A semiconductor device, comprising:
a substrate having a trench formed within the substrate;
a first vertical active region formed within the trench, the first vertical active region including a first doped polysilicon pillar that has a vertical depth greater than a width of the pillar;
a gate electrode pillar disposed in the trench adjacent the vertical active region; and
a second vertical active region formed within the trench adjacent an opposite side of the gate electrode pillar than the first vertical active region, the second vertical active region including a second doped polysilicon pillar, wherein a top surface of the gate electrode pillar and of the first and second doped polysilicon pillars are planar with a top surface of the substrate.

7. A semiconductor device, comprising:
a substrate having a trench formed within the substrate;
at least one vertical source/drain region formed within the trench, the at least one vertical source/drain region including a doped polysilicon pillar having a vertical depth greater than a width of the pillar; and a gate oxide disposed in the trench and a gate electrode pillar formed on the gate oxide, wherein a top surface of the gate electrode pillar and of the doped polysilicon pillar are planar with a top surface of the substrate.

8. The semiconductor device of claim 1, wherein the vertical source/drain region includes a doped region of the substrate adjacent the pillar.

9. The semiconductor device of claim 2, further including a gate insulator disposed in the trench beneath and at a vertical end of the gate electrode pillar.

10. The semiconductor device of claim 4, further including the gate electrode disposed within the third insulative portion between the two vertical active regions.

11. The semiconductor device of claim 10, wherein each vertical active region further includes a doped portion of the substrate extending along the substrate surface defining the bottom of the trench.

12. The semiconductor device of claim 6, further including an insulating layer disposed between each of the doped polysilicon pillars and the gate electrode pillar.

13. The semiconductor device of claim 12, wherein at least one of the first and second vertical active regions further includes a doped substrate region, the doped substrate region being disposed beneath the corresponding doped polysilicon pillar and extending between the corresponding doped polysilicon pillar and the gate electrode pillar.

14. The semiconductor device of claim 13, further including a spacer disposed on a sidewall of one of the doped polysilicon pillar or the gate electrode pillar.

* * * * *

UNITED STATES PATENT AND TRADEMARK OFFICE
CERTIFICATE OF CORRECTION

PATENT NO.   : 6,323,524 B1
DATED        : November 27, 2001
INVENTOR(S)  : May et al.

It is certified that error appears in the above-identified patent and that said Letters Patent is hereby corrected as shown below:

<u>Column 6,</u>
Line 7, after "including", please delete ",".

Signed and Sealed this

Nineteenth Day of March, 2002

Attest:

JAMES E. ROGAN
*Director of the United States Patent and Trademark Office*

*Attesting Officer*